(12) United States Patent
Ho et al.

(10) Patent No.: US 6,916,687 B2
(45) Date of Patent: Jul. 12, 2005

(54) BUMP PROCESS FOR FLIP CHIP PACKAGE

(75) Inventors: Kwun-Yao Ho, Hsien-Tien (TW); Moriss Kung, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 47 days.

(21) Appl. No.: 10/605,305

(22) Filed: Sep. 22, 2003

(65) Prior Publication Data
US 2004/0241911 A1 Dec. 2, 2004

(30) Foreign Application Priority Data
May 28, 2003 (TW) .......................................... 92114347 A

(51) Int. Cl.$^7$ .......................... H01L 21/50; H01L 21/48
(52) U.S. Cl. ....................................... 438/120; 438/127
(58) Field of Search ................................ 438/106, 108, 438/110, 112, 118, 119, 120, 127

(56) References Cited

U.S. PATENT DOCUMENTS 5,843,798 A * 12/1998 Matsuda ..................... 438/106
5,937,277 A * 8/1999 Matsuda et al. ............ 438/119
5,985,694 A * 11/1999 Cho ............................ 438/108

FOREIGN PATENT DOCUMENTS

TW 516142 1/2003

OTHER PUBLICATIONS

U.S. Appl. No. 09/844,224, Hsue et al., filed Apr. 27, 2001.

* cited by examiner

Primary Examiner—David A. Zarneke
Assistant Examiner—Scott B. Geyer
(74) Attorney, Agent, or Firm—Jiang Chyun IP Office

(57) ABSTRACT

A bump process for fabricating bumps and an underfill layer on the active surface of a chip inside a flip chip package is disclosed. An adhesive layer is formed on each of the die pads of the chip. Thereafter, a plurality of bump balls are scattered on the active surface of the chip. The bump balls are vibrated such that only one bump ball is attached to the adhesive layer of each die pad. After removing the un-attached bump balls from the active surface of the chip, an underfill material is applied on the active surface of the chip to encapsulate the bump balls but expose their top surfaces. Thus, the bump process is capable of increasing the reliability of the flip chip package and lower the overall fabrication cost of the flip chip package.

31 Claims, 7 Drawing Sheets

BUMP PROCESS FOR FLIP CHIP PACKAGE

CROSS REFERENCE TO RELATED APPLICATIONS

This application claims the priority benefit of Taiwan application serial no. 92114347, filed on May 28, 2003.

BACKGROUND OF INVENTION

1. Field of the Invention

The present invention generally relates to a process for fabricating a flip chip package. More particularly, the present invention relates to a bump process for fabricating a flip chip package.

2. Description of the Related Art

Flip chip bonding technology is a technique for connecting a chip to a carrier. Before the connection, a chip with an active surface having an array of die pads thereon is provided. Thereafter, bumps are formed respectively on the die pads of the chip. The chip is flipped over and bonded with the carrier such that the die pads of the chip are electrically and structurally connected to the contacts of the carrier via the bumps. Through circuits embedded within the carrier, the chip is able to communicate electrically with an external device. Since flip chip bonding technique is able to produce a flip chip package with a high pin count, a small package area and a short transmission path, flip chip bonding processes are widely adopted in the fabrication of high grade chip packages.

FIGS. 1A through 1H are schematic cross-sectional views showing the steps of forming a convention flip chip package. As shown in FIG. 1A, a chip 102 with an active surface 104 having a plurality of die pads 106 thereon is provided. A passivation layer 108 that exposes a portion of these die pads 106 is formed over the active surface 104 of the chip 102. In addition, a plurality of under bump metallurgy (UBM) layers 110 is formed over various die pads 106. Furthermore, a stress buffer layer (SBL) 112 that exposes various UBM layers 110 is formed over the passivation layer 108. The stress buffer layer (SBL) 112 is fabricated using a material such as benzocyclobutene (BCB).

As shown in FIG. 1B, a photoresist layer 114 is formed on the active surface 104 of the chip 102. Thereafter, as shown in FIG. 1C, a plurality of openings 116 is formed on the photoresist layer 114 by performing photo-exposure and chemical development process. The openings 116 expose various under bump metallurgy layers 110 so that the die pads 106 are indirectly exposed.

As shown in FIG. 1D, a printing process is carried out to fill conductive material into the openings 116. Thereafter, a reflow process is performed so that the conductive material inside the openings 116 is cured to form a plurality of short cylindrical bumps 118. Afterwards, the photoresist layer 114 is removed to expose the sides of the bumps 118 as shown in FIG. 1E. Another reflow process is carried out so that the cylindrical bumps 118 are transformed into spherical bumps 118 as shown in FIG. 1F. Since a chip can be obtained by cutting a wafer, the aforementioned steps can be applied to a wafer prior to cutting the wafer to produce individual chips 102 with bumps 118.

As shown in FIG. 1G, the chip 102 is flipped over and then the bumps 118 are connected to bump pads 12 on the surface of a substrate 10. Hence, the chip 102 is electrically and structurally connected to the substrate 10 via the bumps 118. Finally, as shown in FIG. 1H, underfill material is injected to the space between the chip 102 and the substrate 10. Thereafter, the underfill material is cured to form an underfill layer 20. The underfill layer 20 provides to buffer any thermal stress between the chip 102 and the substrate 10 so that cracks at the junction between the bumps 118 and the chip 102 or the substrate 10 is greatly minimized.

However, the conventional flip chip fabricating process has the following drawbacks: 1. Since a photoresist layer and a photolithographic process are required for fabricating cylindrical bumps, therefore the fabrication cost of the flip chip package is increased. 2. The printing process deployed to form bumps in the openings often produces voids close to the bottom section of the bumps and hence the reliability of the chip connection in the package is poor. 3. The conventional underfill dispensing process frequently produces voids in the underfill layer. Too many voids in the underfill layer may lead to a delamination between the chip and the substrate. Accordingly, the reliability of the package is reduced.

SUMMARY OF INVENTION

Accordingly, one object of the present invention is to provide a process of fabricating spherical bumps and an underfill layer on the active surface of a chip inside a flip chip package capable of improving the reliability and reducing the production cost of the flip chip package.

To achieve these and other advantages and in accordance with the purpose of the invention, as embodied and broadly described herein, the invention provides a process of fabricating at least a bump and an underfill layer on the active surface of a chip inside a flip chip package. The chip has at a plurality of die pads on the active surface of the chip. First, an adhesive layer is formed over each of the die pads on the active surface of the chip. Thereafter, a plurality of bump balls are scattered on the active surface of the chip. The bump balls are vibrated such that only one bump ball adheres to the adhesion layer of each die pad. The remaining unattached bump balls are removed. An underfill material is applied on the active surface of the chip to encapsulate the attached bump balls except their top surfaces. Accordingly, no photoresist layer and photolithography process are required for fabricating the bump balls, and therefore the fabrication process can be greatly simplified and thus the fabrication cost can be effectively reduced. Further, the reliability of the flip chip package can also be promoted.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
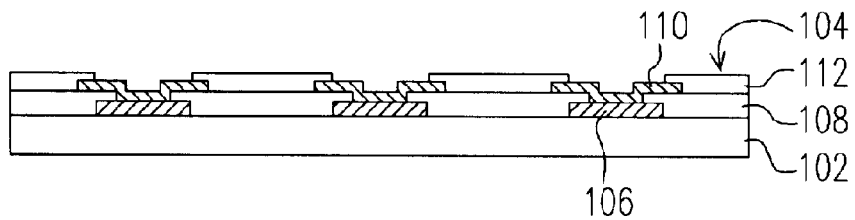
FIGS. 1A through 1H are schematic cross-sectional views showing the steps of fabricating a conventional flip chip package.
Figure 1B:
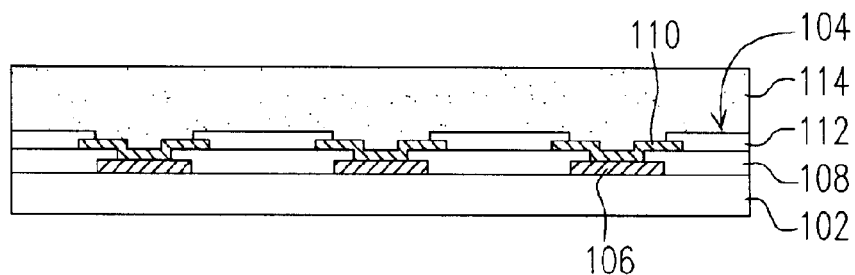
Figure 1C:
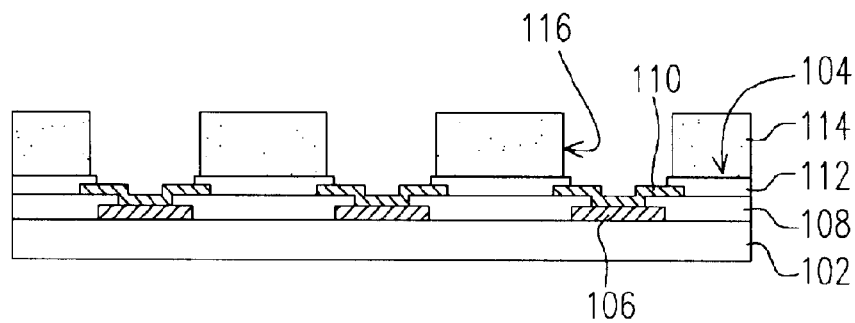
Figure 1D:
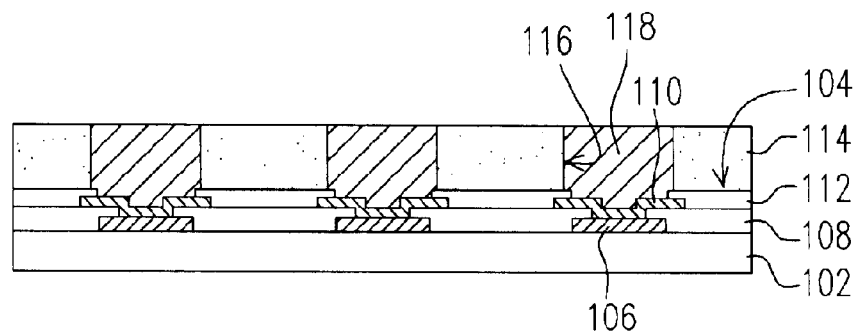
Figure 1E:
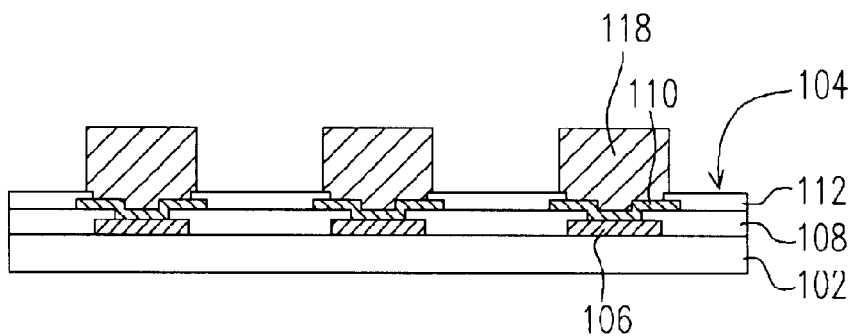
Figure 1F:
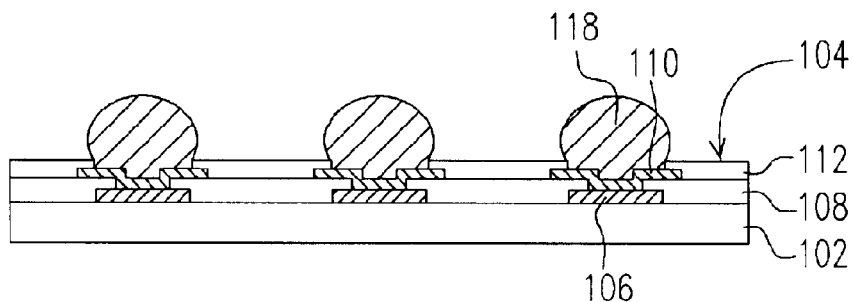
Figure 1G:
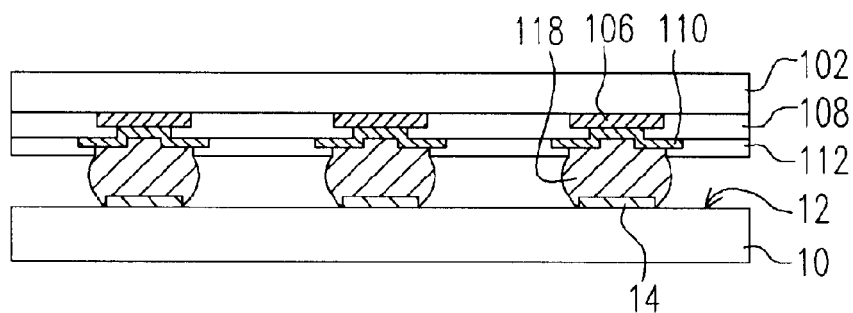
Figure 1H:
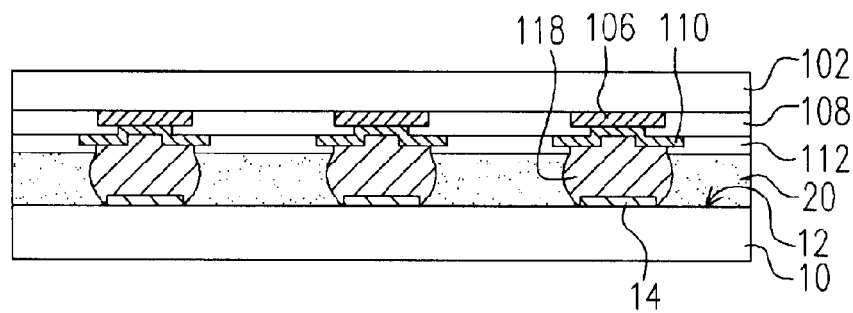

Reference will now be made in detail to the present preferred embodiments of the invention, examples of which are illustrated in the accompanying drawings. Wherever possible, the same reference numbers are used in the drawings and the description to refer to the same or like parts.

Figure 2A:
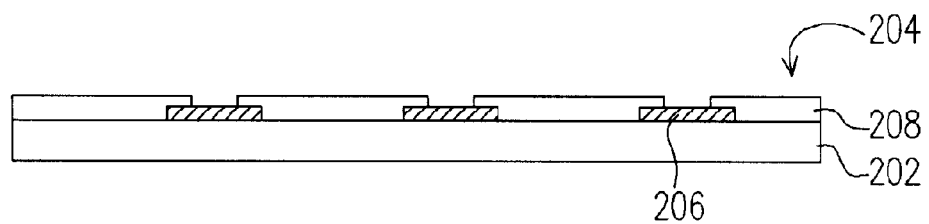
FIGS. 2A through 2H are schematic cross-sectional views showing the steps of a first bump process for fabricating a flip chip package according to one preferred embodiment of this invention.

FIGS. 2A through 2H are schematic cross-sectional views showing the steps of a bump process for fabricating a flip chip package according to one preferred embodiment of this invention. As shown in FIG. 2A, a chip 202 (or a wafer) with an active surface 204 having a plurality of die pads 206 thereon is provided. A passivation layer 208 is formed on the active surface 204 of the chip 202 such that a portion of the die pads 206 is exposed. In addition, an under-bump-metallurgy (UBM) (not shown) layer can be optionally formed on each of the die pads 206 of the chip 202. Similarly, a stress buffer layer (SBL) (not shown) can be optionally formed over the passivation layer 208. As the process of forming under-bump-metallurgy layers and the stress buffer layer has been already described with reference to FIG. 1A, and therefore the detailed description thereof is omitted.

Figure 2B:
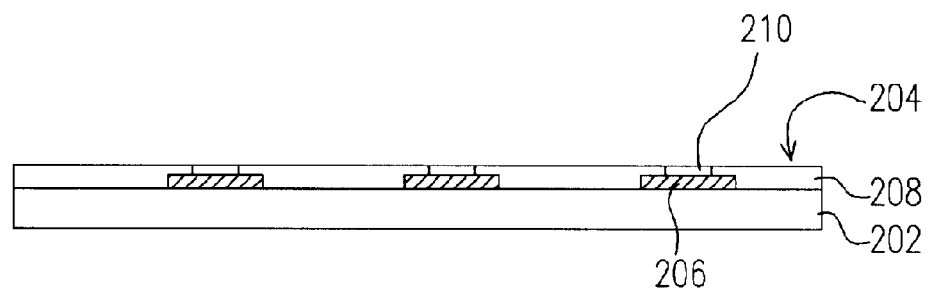

As shown in FIG. 2B, an adhesive layer 210 is formed on the surface of each die pads 206. The adhesive layer 210 as a sticky film is preferably comprised of a material that has gluing properties at room temperature, examples of such materials include, but not limited to, an organic surface preservation (OSP) or a flux.

Figure 2C:
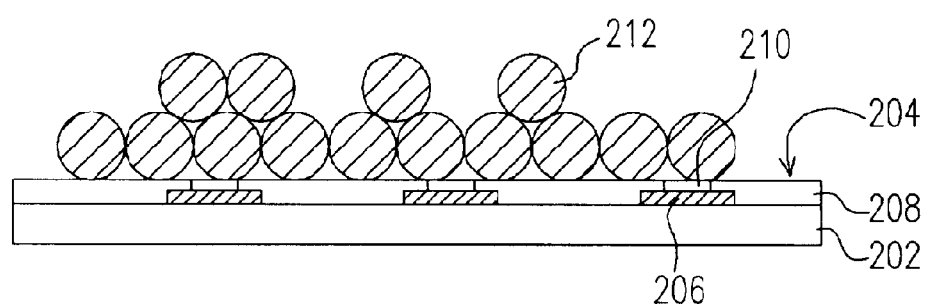

As shown in FIG. 2C, a large number of bump balls 212 is scattered over the active surface 204 of the chip 202 so that the bump balls 212 are roughly evenly distributed over the active surface 204. In this embodiment, the bump balls 212 are fabricated from a solder material, for example.

Figure 2D:
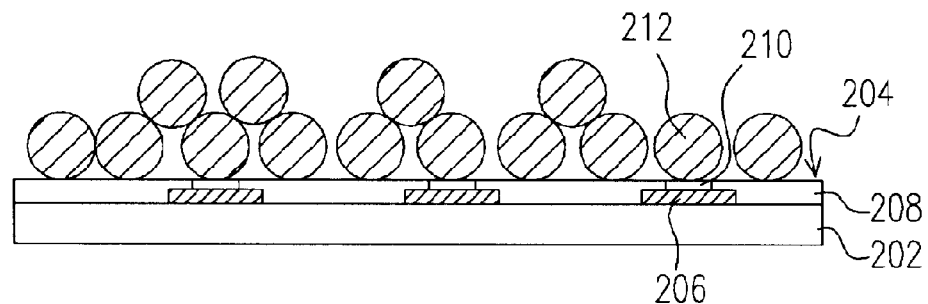

As shown in FIG. 2D, the bump balls 212 are vibrated mechanically using an instrument such as an ultrasonic vibrator. The vibration moves the bump balls 212 on the active surface 204 of the chip 202. With the bump balls 212 set into motion on the active surface 204, one bump ball 212 will eventually adhere to each adhesive layer 210 as the area of each adhesion layer 210 is designed to catch only one bump ball 212.

Figure 2E:
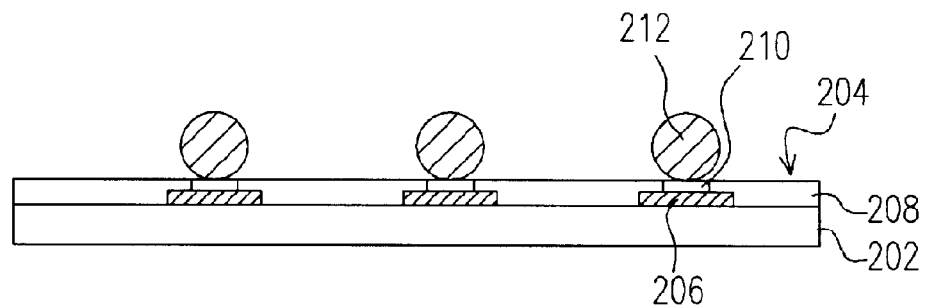

As shown in FIG. 2E, a vacuum suction process can be used to remove all the non-attached bump balls 212 from the surface of the chip 202. The bump balls 212 remaining on the adhesive layer 210 ultimately become the bumps for flip chip connection.

Figure 2F:
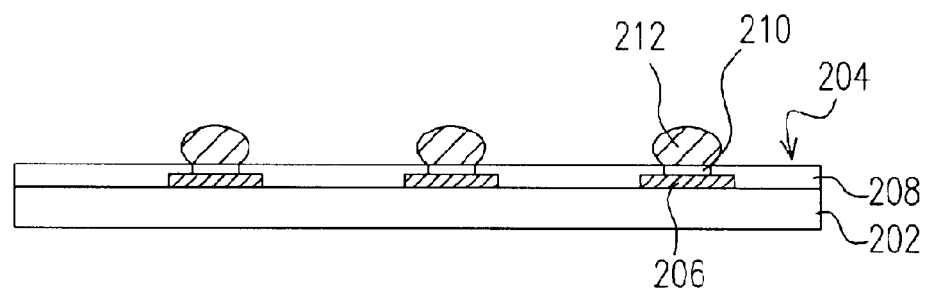

In this embodiment, a reflow process is performed as shown in FIG. 2F. Within the reflow operation, the bump balls 212 are not only firmly bonded to the respective die pads 206 but also flattened out a little to produce a squashed profile. Furthermore, a coining process may be carried out to planarize the top end of the bump balls 212 so as to improve the degree of co-planarity.

Figure 2G:
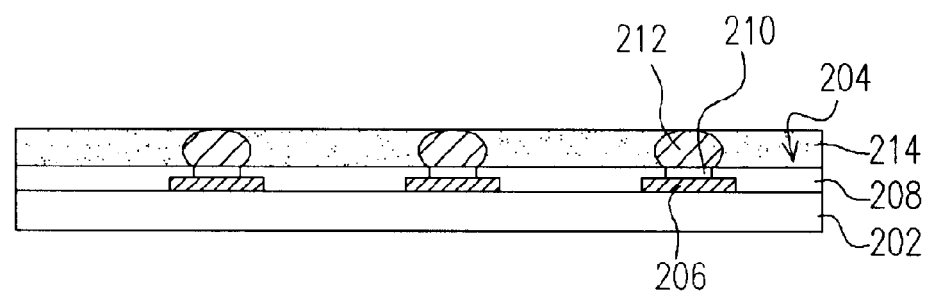

As shown in FIG. 2G, a coating operation is carried out to form a layer of underfill material over the active surface 204 of the chip 202 surrounding the bump balls 212. Thereafter, the underfill material is semi-cured to form an underfill layer 214.

Figure 2H:
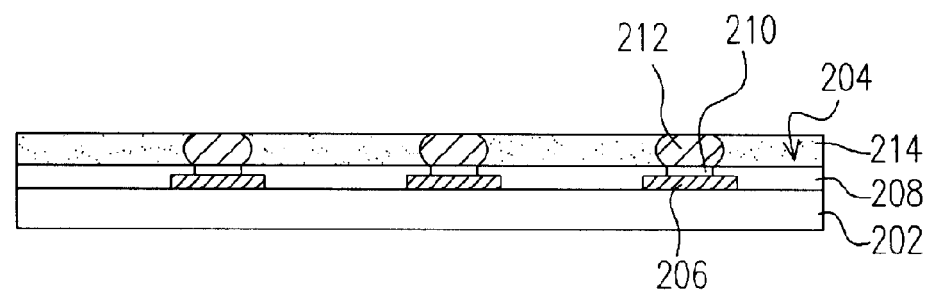

Since the underfill layer will encapsulate all of the bump balls 212, therefore a polishing operation is carried out to remove a portion of the underfill layer 214 and to expose a top surface of each the bump ball 212 as shown in FIG. 2H. To provide a larger contact area, the polishing operation can also be used to remove a top portion of the bump balls 212 so that a larger contact area and planar surface is formed at the top surface of the bump balls 212. Similarly, to provide a larger junction area, the top surface of the bump balls 212 may be slightly flattened out by applying pressure during the reflow process. Since the top surface of the bump balls 212 has been flattened out, the polishing operation only need to remove the underfill layer 214 and expose the flat top surface of the bump balls 212. After the polishing operation, an additional cleaning operation can be carried out to remove any residual underfill material from the top surface of the bump balls 212 to provide a clean metallic bonding surface. Furthermore, flux material can be applied to the exposed surface of the bump balls 212 to protect the bump balls 212 as well as to increase the bondability of the bump balls 212.

Because individual chips can be obtained by cutting a fabricated wafer, it is possible to perform all the aforementioned steps on the wafer before cutting the wafer. In other words, all the process steps of forming the bump balls 212 and the underfill layer 214 can be carried out on a wafer before dicing the wafer to form individual chips 202.

Figure 4:
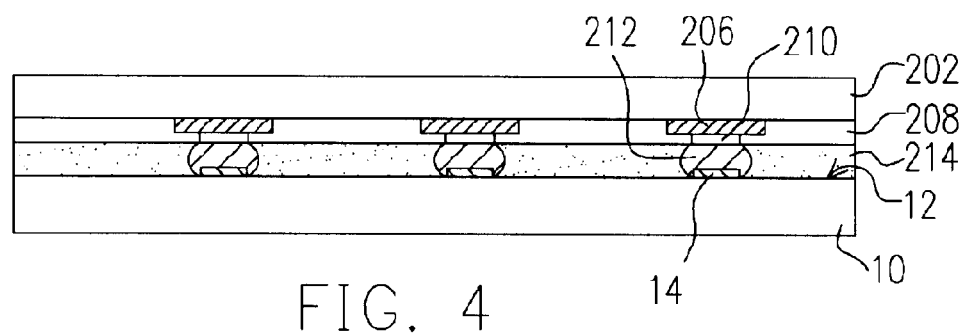
FIG. 4 is a schematic cross-sectional view showing a flip chip having bump balls thereon as shown in FIG. 2H bonded to a substrate.

FIG. 4 is a schematic cross-sectional view showing a flip chip having bump balls thereon as shown in FIG. 2H bonded to a substrate. Since the underfill layer 214 has already formed on the active surface 204 of the chip 202, the bump balls 212 can respectively connect with the bonding pads 14 on the substrate 10 after flipping over the chip 202. In addition, the underfill layer 214 is cured so that the underfill material is able to fill the space bounded by the chip 202, the substrate 10 and the bump balls 212 without carrying out a specific underfill material filling process. This arrangement lowers the probability of producing voids in the underfill layer 214, thereby increasing the reliability of the chip 202 inside the flip chip package.

Figure 3A:
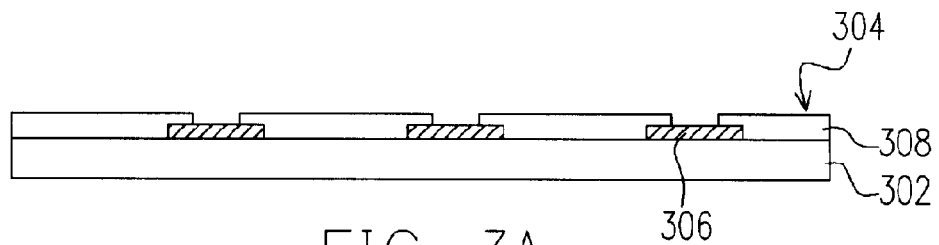
FIGS. 3A through 3H are schematic cross-sectional views showing the steps of a second bump process for fabricating a flip chip package according to another preferred embodiment of this invention.

FIGS. 3A through 3H are schematic cross-sectional views showing the steps of a bump process for fabricating a flip chip package according to another one preferred embodiment of this invention. As shown in FIG. 3A, a chip 302 with an active surface 304 having a plurality of die pads 306 thereon is provided. A passivation layer 308 is formed on the active surface 304 of the chip 302, wherein a portion of the die pads 306 is exposed. In addition, an under-bump-metallurgy (UBM) (not shown) layer can be optionally formed on each of the die pads 306 of the chip 302. Similarly, a stress buffer layer (SBL) (not shown) can be optionally formed over the passivation layer 308. As the process of forming under-bump-metallurgy layer and the stress buffer layer has been already described in detail with reference to FIG. 1A, therefore a detailed description thereof is omitted.

Figure 3B:
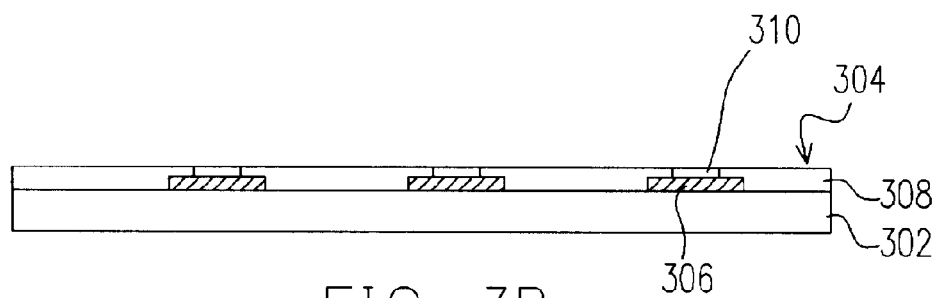

As shown in FIG. 3B, an adhesive layer 310 is formed on the exposed surface of the die pads 306. The adhesive layer 310 is preferably comprised of a material that has gluing properties at soldering temperature including, for example, a solder material, a low melting point metal or a low melting point alloy.

Figure 3C:
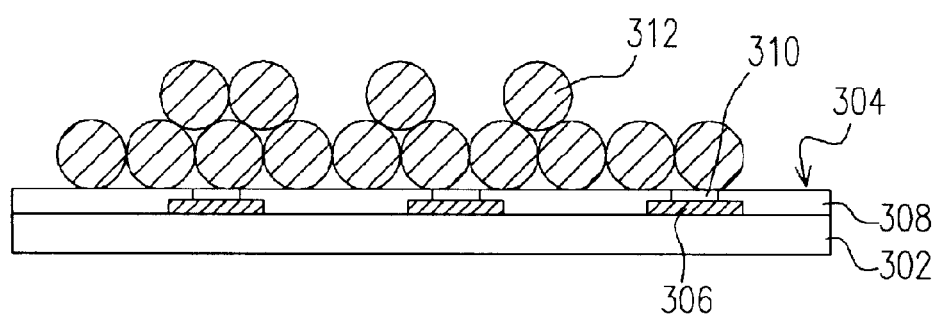

As shown in FIG. 3C, a large number of bump balls 312 is scattered over the active surface 304 of the chip 302 so that the bump balls 312 are roughly evenly distributed over the active surface 304. In this embodiment, the bump balls 312 are comprised of a high melting point metal or a high melting point alloy, for example. These bump balls 312 have a melting point higher than the adhesive layer 310.

Figure 3D:
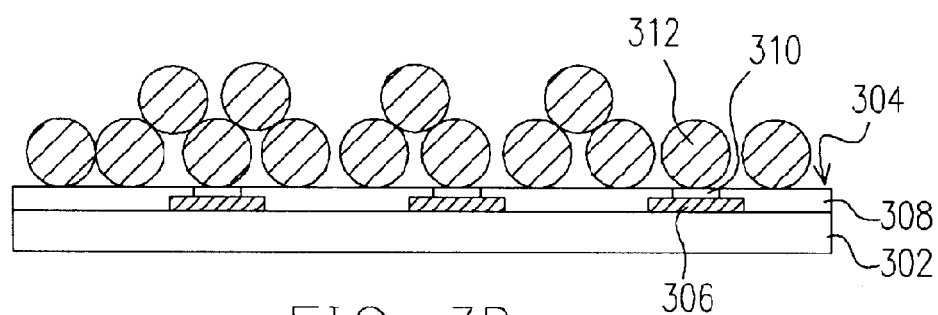

As shown in FIG. 3D, the bump balls 312 are vibrated mechanically using an instrument such as an ultrasonic vibrator. The vibration moves the loose bump balls 312 on the active surface 304 of the chip 302. In the meantime, a reflow process is carried out on the adhesive layer 310 so that the adhesive layer 310 melts under the soldering temperature. However, the bump balls 312 remain in a solid state due to its higher melting point. The melted adhesion layer 310 has great cohesive strength with the solid bump balls 312. Hence, after the reflow process, one bump ball 312 will be attached to the adhesion layer 310 on each die pad 306. In other words, the bump balls 312 are respectively connected to die pads 306 via the adhesion layers 310.

Figure 3E:
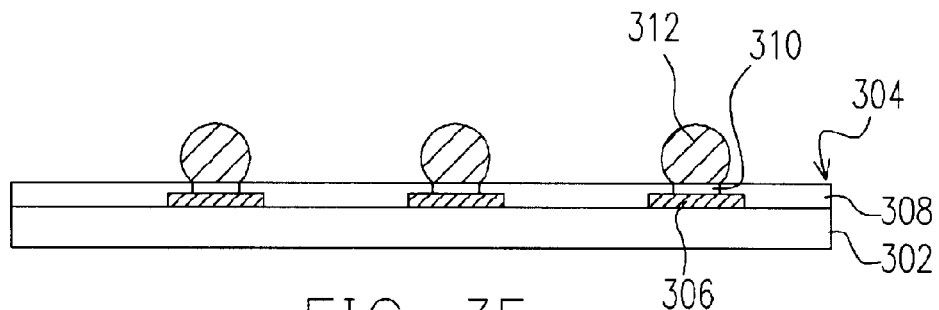

As shown in FIG. 3E, a vacuum suction process can be used to remove all the non-attached bump balls 312 from the surface of the chip 302. The bump balls 312 remaining on the adhesive layer 310 ultimately become the bumps for flip chip connection.

Figure 3F:
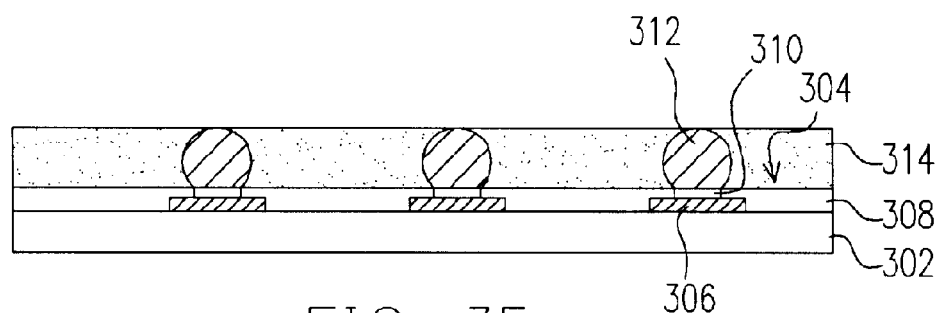

As shown in FIG. 3F, a coating operation is carried out to form a layer of underfill material over the active surface 304 of the chip 302 to encapsulate the bump balls 312. Thereafter, the underfill material is semi-cured to form an underfill layer 314.

Figure 3G:
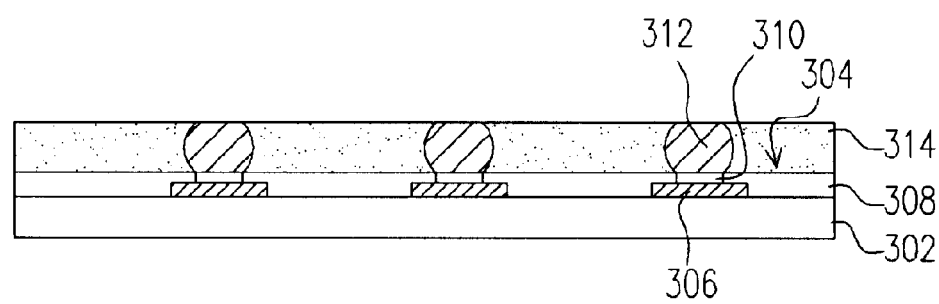

As shown in FIG. 3G, a polishing operation, for example, is carried out to remove a portion of the underfill layer 314 and to expose a top surface of the bump balls 312. Moreover, the polishing operation can also be used to remove a portion of the top surface of the bump balls 312 so that a larger and flatter contact area is formed at the top surface of the bump balls 312.

Figure 3H:
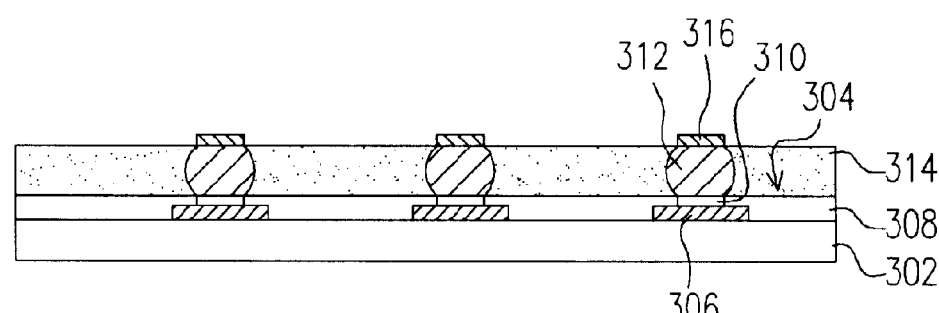

As shown in FIG. 3H, a surface finish layer 316 for increasing the bonding strength with an external contact is formed on the exposed surface of the bump balls 312. The surface finish layer 316 is a nickel-gold (Ni/Au) layer or a solder layer, for example. However, the surface finish layer 316 can also be an organic surface preservation (OSP) layer for preventing the surface of the bump balls 312 from oxidation.

Because individual chips can be obtained by cutting a fabricated wafer, it is possible to perform all the aforementioned steps on the wafer before cutting the wafer. In other words, all the process steps of forming the bump balls 312 and the underfill layer 314 can be carried out on a wafer before dicing the wafer to form individual chips 302.

Figure 5:
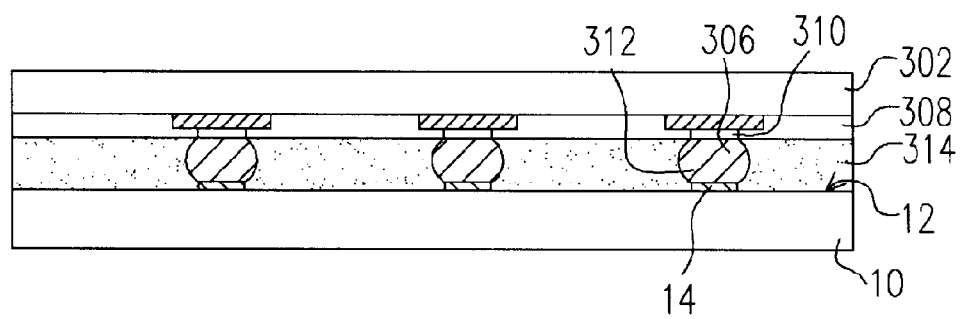
FIG. 5 is a schematic cross-sectional view showing a flip chip having bump balls thereon as shown in FIG. 3H bonded to a substrate.

FIG. 5 is a schematic cross-sectional view showing a flip chip having bump balls thereon as shown in FIG. 3H bonded to a substrate. Since the underfill layer 314 has already formed on the active surface 304 of the chip 302, the bump balls 312 can respectively connect with the bonding pads 14 on the substrate 10 after flipping over the chip 302. In addition, the underfill layer 314 is cured so that the underfill material is able to fill the space bounded by the chip 302, the substrate 10 and the bump balls 312 without carrying out a specific underfill material filling process. This arrangement lowers the probability of producing voids in the underfill layer 314, thereby increasing the reliability of the chip 302 inside the flip chip package.

In the first embodiment of this invention, solder bump balls as well as an underfill layer are formed on the active surface of a chip. An adhesive material (for example, flux) with adhesive properties at room temperature is used to position and attach a bump ball to each die pad. Finally, an underfill material is formed over the active surface of the chip to encapsulate the bump balls but to expose a top surface of the bump balls.

Similarly, in the second embodiment of this invention, metal bump balls as well as an underfill layer are formed on the active surface of a chip. The bump balls are fabricated using a high melting point metal (or a high melting point alloy). Using an adhesive material (for example, a solder material) having adhesive properties at the soldering temperature to form an adhesive layer, the bump balls are positioned and attached to the adhesive layer when the temperature is raised to the melting point temperature of the solder material. Thereafter, an underfill material is formed over the active surface of the chip to encapsulate the bump balls but to expose a top surface of the bump balls.

In summary, the bump process for fabricating a flip chip package includes the following advantages: 1. Bump balls are used to form the bumps in the flip chip package. Since the bottom section of the bump balls for connecting with the die pads of the chip no longer has any voids, the reliability of the flip chip package is improved. 2. A simple mechanical vibrator is used to vibrate bump balls into position on the adhesion layer for forming the bump balls instead of carrying out a complicated and time-consuming photolithographic process. Hence, production cost of the flip chip package is greatly reduced. 3. Underfill material is applied over the active surface of the chip to encapsulate the bump balls. Hence, the underfill material can be directly used to fill up the space bounded by the chip and the chip carrier when the chip is flipped over and bonded with the chip carrier (or main board). Since there is no need to carry out a conventional underfill filling process, overall reliability of the flip chip package is improved. 4. The bump process can be applied to fabricate a chip scale package (CSP). The chip is capable of connecting to a system circuit board (for example, a main board) via the bump balls in a direct chip attaching (DCA) method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bump process for fabricating a plurality of bumps and an underfill layer on the active surface of a chip in a flip chip package, wherein the chip has a plurality of die pads on the active surface of the chip, the bump process at least comprising the steps of:

(a) forming an adhesive layer over each of the die pads;

(b) scattering a plurality of bump balls on the active surface of the chip;

(c) vibrating the bump balls such that one of the bump balls is attached to the adhesive layer on each die pad;

(d) removing the un-attached bump balls;

(e) applying an underfill material on the active surface of the chip to encapsulate the bump balls; and (f) removing a portion of the underfill material to expose a top surface of eachthe bump ball.

2. The bump process of claim 1, wherein the step (c) is performed by using an ultrasonic vibrator.

3. The bump process of claim 1, wherein the bump ball is comprised of a solder material.

4. The bump process of claim 3, wherein after the step (d) further comprises a step (d1) of performing a reflow process to soften the bump balls.

5. The bump process of claim 3, wherein the adhesive layer comprises a flux material.

6. The bump process of claim 4, wherein after the step (d1) further comprises a step (d2) of applying a coining process to planarize the top surface of each bump ball.

7. The bump process of claim 1, wherein the adhesive layer is comprised of a solder material and the bump ball has a melting point higher than the adhesive layer.

8. The bump process of claim 7, wherein the step (c) further comprises performing a reflow process to melt the adhesive layer such that one of the bump balls adheres to the adhesive layer on each die pad.

9. The bump process of claim 1, wherein the step (d) is performed by a vacuum suction operation.

10. The bump process of claim 1, wherein the step (e) is performed by a coating process.

11. The bump process of claim 1, wherein the step (f) further comprises removing a portion of each the bump ball at the top surface.

12. The bump process of claim 1, wherein the step (f) is performed by a polishing operation.

13. The bump process of claim 1, wherein after the step (f) further comprises forming a surface finish layer on the exposed surface of the bump ball.

14. A bump process on a chip for a flip chip package, wherein the chip has a plurality of die pads on an active surface of the chip, the bump process at least comprising the steps of:
  (a) applying an sticky film over each of the die pads;
  (b) scattering a plurality of solder balls on the active surface of the chip;
  (c) vibrating the solder balls such that only one of the solder balls is attached to the sticky film on each die pad;
  (d) removing the un-attached solder balls; and
  (e) performing a reflow process to bond the solder balls firmly to the die pads respectively.

15. The bump process of claim 14, further comprising the steps of:
  (f) applying an underfill material on the active surface of the chip to encapsulate the solder balls; and
  (g) removing a portion of the underfill material to expose a top surface of each the solder ball.

16. The bump process of claim 15, wherein the step (f) is performed by a coating process.

17. The bump process of claim 15, wherein the step (g) further comprises removing a portion of each the solder ball at the top surface.

18. The bump process of claim 15, wherein the step (g) is performed by a polishing operation.

19. The bump process of claim 15, wherein after the step (g) further comprises forming a surface finish layer on the top surface of each the solder ball.

20. The bump process of claim 14, wherein the step (c) is performed by using an ultrasonic vibrator.

21. The bump process of claim 14, wherein the sticky film comprises a flux material.

22. The bump process of claim 14, wherein after the step (e) further comprises a step (e1) of applying a coining process to planarize a top surface of eachthe solder ball.

23. The bump process of claim 14, wherein the step (d) is performed by a vacuum suction operation.

24. A bump process on a chip for a flip chip package, wherein the chip has a plurality of die pads on an active surface of the chip, the bump process at least comprising the steps of:
  (a) forming a solder layer over each of the die pads;
  (b) scattering a plurality of metal balls on the active surface of the chip, wherein the metal ball has a melting point higher than the solder layer;
  (c) applying a reflow process and vibrating the metal balls such that only one of the metal balls is attached to the solder layer on each die pad; and
  (d) removing the un-attached metal balls.

25. The bump process of claim 24, further comprising the steps of:
  (e) applying an underfill material on the active surface of the chip to encapsulate the metal balls; and
  (f) removing a portion of the underfill material to expose a top surface of each metal ball.

26. The bump process of claim 25, wherein the step (e) is performed by a coating process.

27. The bump process of claim 25, wherein the step (f) further comprises removing a portion of each the metal ball at its top surface.

28. The bump process of claim 25, wherein the step (f) is performed by a polishing operation.

29. The bump process of claim 25, wherein after the step (f) further comprises forming a surface finish layer on the top surface of eachthe metal ball.

30. The bump process of claim 24, wherein the step (c) is performed by using an ultrasonic vibrator.

31. The bump process of claim 24, wherein the step (d) is performed by a vacuum suction operation.

* * * * *